(12) United States Patent
Ergas

(10) Patent No.: US 10,319,674 B2
(45) Date of Patent: Jun. 11, 2019

(54) PACKAGED ASSEMBLY FOR HIGH DENSITY POWER APPLICATIONS

(71) Applicant: Infineon Technologies Americas Corp., El Segundo, CA (US)

(72) Inventor: Franck Ergas, San Jose, CA (US)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 8 days.

(21) Appl. No.: 14/877,059

(22) Filed: Oct. 7, 2015

(65) Prior Publication Data

US 2016/0126177 A1 May 5, 2016

Related U.S. Application Data

(60) Provisional application No. 62/072,372, filed on Oct. 29, 2014.

(51) Int. Cl.
*H01L 23/02* (2006.01)
*H05K 1/18* (2006.01)
(Continued)

(52) U.S. Cl.
CPC ...... *H01L 23/49838* (2013.01); *H01L 23/041* (2013.01); *H01L 23/49811* (2013.01);
(Continued)

(58) Field of Classification Search
CPC ............. H01L 23/49838; H01L 23/041; H01L 23/481; H01L 23/49861; H01L 23/49827;
(Continued)

(56) References Cited

U.S. PATENT DOCUMENTS 5,311,407 A * 5/1994 Lumbard .......... H01L 23/49534
174/536
6,072,122 A * 6/2000 Hosoya .................. H01L 23/24
174/524

(Continued)

FOREIGN PATENT DOCUMENTS

JP 2007 049099 A 2/2007

OTHER PUBLICATIONS

Qi-Jin Jia et el. "*Microstructure and Properties of electronic packaging box with hight silicon aluminum-based alloy by semi-solid thixoforming*". Transactions of Nonferrous Metals Society of China, vol. 23, No. 1, pp. 80-85.

*Primary Examiner* — Rockshana D Chowdhury
(74) *Attorney, Agent, or Firm* — Slater Matsil, LLP

(57) ABSTRACT

A packaged assembly for high density power applications includes a case having shelves on opposing walls, and a double-sided substrate disposed on the shelves of the case, the double-sided substrate having a semiconductor die on a first side of the double-sided substrate and circuit elements on a second side of the double-sided substrate. The case includes aluminum silicon (AlSi). The double-sided substrate is secured to the case by an epoxy. The double-sided substrate a thick film substrate and includes beryllium oxide (BeO) or aluminum oxide ($Al_2O_3$). The semiconductor die on the first side of the double-sided substrate is coupled to at least one of the circuit elements on the second side of the double-sided substrate by a through substrate via. The packaged assembly also further includes invertible leads coupled to the double-sided substrate by lead frames.

22 Claims, 4 Drawing Sheets

(51) Int. Cl.
*H01L 23/498* (2006.01)
*H01L 23/28* (2006.01)
*H01L 23/04* (2006.01)

(52) U.S. Cl.
CPC .. *H01L 23/49827* (2013.01); *H01L 23/49861* (2013.01); *H05K 1/181* (2013.01); *H01L 2924/0002* (2013.01); *H01L 2924/19106* (2013.01)

(58) Field of Classification Search
CPC ....... H01L 23/49811; H01L 2924/0002; H01L 2924/19106; H05K 1/181
USPC ......................................................... 361/752
See application file for complete search history.

(56) References Cited

U.S. PATENT DOCUMENTS

| | | | | |
|---|---|---|---|---|
| 6,324,072 B1* | 11/2001 | Lorenz | ................. | H01L 25/072 257/723 |
| 6,424,034 B1* | 7/2002 | Ahn | ....................... | H01L 25/18 257/685 |
| 6,890,798 B2* | 5/2005 | McMahon | ........ | H01L 23/49833 257/E23.063 |
| 6,958,535 B2* | 10/2005 | Hirano | ................ | H01L 23/3737 257/668 |
| 7,132,746 B2* | 11/2006 | Brandenburg | ......... | B23K 35/26 257/713 |
| 7,208,824 B2* | 4/2007 | Lee | ................... | H01L 23/49811 257/685 |
| 7,505,276 B2* | 3/2009 | Dangelmaier | ........ | H01L 23/055 361/735 |
| 7,687,903 B2* | 3/2010 | Son | ..................... | H01L 23/3107 257/723 |
| 7,742,303 B2* | 6/2010 | Azuma | ..................... | B60L 3/12 361/699 |
| 7,751,194 B2* | 7/2010 | Sakamoto | .......... | H05K 7/20009 165/185 |
| 8,207,607 B2* | 6/2012 | Yamagishi | ............ | H01L 23/315 257/680 |
| 8,232,615 B2* | 7/2012 | Leclair | ................ | B81C 1/00238 257/416 |
| 8,472,197 B2* | 6/2013 | Higashibata | ........ | B60R 16/0239 165/185 |
| 2004/0212965 A1* | 10/2004 | Ishii | ...................... | H01L 23/473 361/709 |
| 2005/0132747 A1* | 6/2005 | Takemori | .............. | H01L 33/486 63/12 |
| 2006/0124834 A1* | 6/2006 | Mizutani | ............ | G03F 7/70325 250/216 |
| 2006/0249280 A1* | 11/2006 | Chuang | ................. | H01L 23/367 165/104.33 |
| 2008/0023824 A1* | 1/2008 | Salzman | ............... | H01L 23/481 257/724 |
| 2008/0053700 A1* | 3/2008 | O'Connor | ............ | B23K 20/122 174/564 |
| 2009/0283919 A1* | 11/2009 | Tsui | .................... | H01L 23/4334 257/778 |
| 2011/0013349 A1* | 1/2011 | Morikita | ............... | H05K 1/0218 361/679.02 |
| 2011/0075451 A1* | 3/2011 | Bayerer | .................. | H01L 24/06 363/37 |
| 2012/0320544 A1 | 12/2012 | Ohhashi et al. | | |
| 2013/0020695 A1* | 1/2013 | Na | ....................... | H01L 23/49555 257/696 |
| 2014/0118956 A1* | 5/2014 | Kim | ..................... | H01L 23/049 361/728 |

* cited by examiner

PACKAGED ASSEMBLY FOR HIGH DENSITY POWER APPLICATIONS

The present application claims the benefit of and priority to a provisional patent application entitled "Hermetically Packaged Hybrid Assembly with Double-Sided Substrate for High Density Power Applications," Ser. No. 62/072,372 filed on Oct. 29, 2014. The disclosure in this provisional application is hereby incorporated fully by reference into the present application.

BACKGROUND

Semiconductor power modules control electrical power to circuits and devices, such as motors, actuators, controllers or the like. When high reliability is required for use in extreme or harsh environments, such as in high performance vehicles, aircrafts, space shuttles and satellites, it is important to provide robust packaged assemblies that are small, lightweight, and electrically and thermally efficient. For example, in some space and satellite applications, packaged assemblies with power semiconductor devices require packaging of high thermal conductivity in order to maintain useful operation of the devices. However, most packaging material with good thermal characteristics does not offer matching substrate to package coefficient of thermal expansion (CTE).

In a conventional packaged assembly, a substrate is attached to a package using hardware and hard soldering paste, which add weight to the packaged assembly. The contact points between the hardware and the substrate consume the limited usable area of the substrate. Moreover, due to a mismatch of coefficient of thermal expansion (CTE) between the substrate and the package, the packaged assembly experiences thermal stress due to changes in temperature, which can cause damage to the power semiconductor devices and circuitry on the substrate.

Accordingly, there is a need to overcome the drawbacks and deficiencies in the art by providing a small, lightweight, and electrically and thermally efficient packaged assembly for high density power applications.

SUMMARY

The present disclosure is directed to a packaged assembly for high density power applications, substantially as shown in and/or described in connection with at least one of the figures, and as set forth in the claims.

DETAILED DESCRIPTION

Figure 1A:
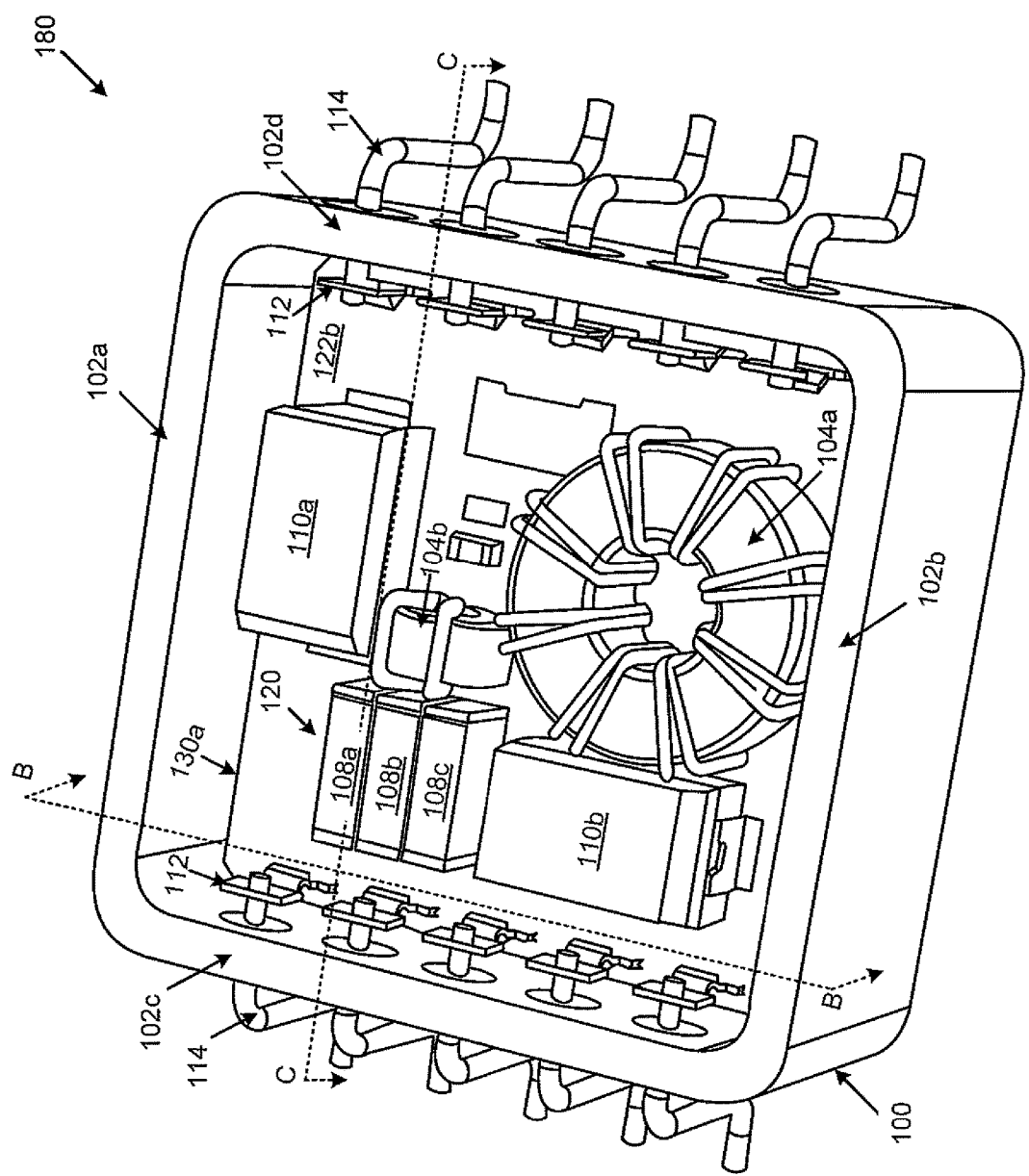
FIG. 1A illustrates a perspective view of a portion of a packaged assembly, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates a perspective view of a portion of a packaged assembly, according to one implementation of the present application. As illustrated in FIG. 1A, packaged assembly 180 includes case 100, double-sided substrate 120 disposed in case 100, and leads 114 electrically coupled to semiconductor devices and/or circuit elements formed on double-sided substrate 120 through lead frames 112 for external connection. Among other components, a hermetic lid and an encapsulating molding compound or gap filler are omitted from FIG. 1A for purposes of clarity, but may be included in packaged assembly 180.

In the present implementation, case 100 includes a hermetic lid (not explicitly shown in FIG. 1A), walls 102a, 102b, 102c and 102d, a shelf (not explicitly shown in FIG. 1A) on each of opposing walls 102a and 102b for holding and providing support for double-sided substrate 120, and a bottom plate (not explicitly shown in FIG. 1A). Case 100 includes a material with low mass, high thermal conductivity and high machinability. In the present implementation, case 100 includes aluminum silicon (AlSi). The high thermal conductivity of AlSi facilitates transferring heat generated by circuit elements and power semiconductor devices on double-sided substrate 120 out of packaged assembly 180. As weight saving is crucial in space and satellite applications, case 100 having AlSi is super lightweight, thereby substantially reducing the overall weight of packaged assembly 180. Moreover, AlSi is highly machinable, which means that the manufacturing process of case 100 (e.g., cutting, removing portions thereof and obtaining a good finish) requires little power and time. With high machinability, it is also easy and quick to make configuration changes to accommodate different footprints of different substrates if needed. In other implementations, case 100 may include other suitable material with low mass, high thermal conductivity and high machinability. Also, as discussed below, the CTE of case 100 is closely matched with double-sided substrate 120, such that a change in volume (e.g., expansion or contraction) of case 100 in response to a change in temperature does not introduce stress to double-sided substrate 120 or locations in packaged assembly where an epoxy is used to secure double-sided substrate 120 to case 100. As such, additional hardware and hard soldering paste are not required to secure double-sided substrate 120 in place, thereby further reducing the overall weight of packaged assembly 180.

In the present implementation, double-sided substrate 120 includes a front side (not explicitly shown in FIG. 1A) and a back side (e.g., back side 122b). As illustrated in FIG. 1A, back side 122b of double-sided substrate 120 includes various circuit elements formed thereon. As illustrated in FIG. 1A, toroidal inductors 104a and 104b, ceramic capacitor stacks 108a, 108b and 108c, tantalum capacitors 110a and 110b and various other circuit elements are formed on back side 122b of double-sided substrate 120. Toroidal inductors 104a and 104b each include a circular ring shaped magnetic core around which a strip of wire is wound. Toroidal inductors 104a and 104b are configured to filter and reduce noise in the circuitry formed on double-sided substrate 120, for example. Tantalum capacitors 110a and 110b are configured to reduce an output noise of a point of load converter formed on double-sided substrate 120, for example. Ceramic capacitor stacks 108a, 108b and 108c are also formed on back side 122b of double-sided substrate 120, and configured to filter an input noise of the point of load converter formed on double-sided substrate 120, for example.

As illustrated in FIG. 1A, leads 114 extend through walls 102c and 102d of case 100, and are electrically coupled to power semiconductor devices and/or circuit elements formed on double-sided substrate 120 through lead frames 112 along walls 102c and 102d of case 100. In the present implementation, leads 114 are invertible leads that can be inverted 180° from their current positions as shown in FIG. 1A, such that both the hermetic lid and bottom plate 116 of case 100 can be used as a mounting surface for packaged assembly 180. In the present implementation, leads 114 are made of copper-based metal matrix composite alloys mixed with aluminum, oxide and/or ceramic particles. Leads 114 each have a diameter of approximately 30 mils (i.e., one thirty thousandth of an inch), thus allowing for greater current carrying capability and mechanical strength to accommodate power semiconductor devices in packaged assembly 180. In other implementations, leads 114 may be made of other conductive materials, and have a diameter of greater or less than 30 mils.

It should be noted that, in the present implementation, a hermetic lid (not explicitly shown in FIG. 1A) may be laser welded to case 100 to hermetically seal double-sided substrate 120 in packaged assembly 180. Also, an encapsulating molding compound or gap filler may partially or entirely fill the space between circuit elements formed on back side 122b of double-sided substrate 120 and the lid, such that hermetically sealed packaged assembly 180 can withstand g-forces of 5000 g or more.

Figure 1B:
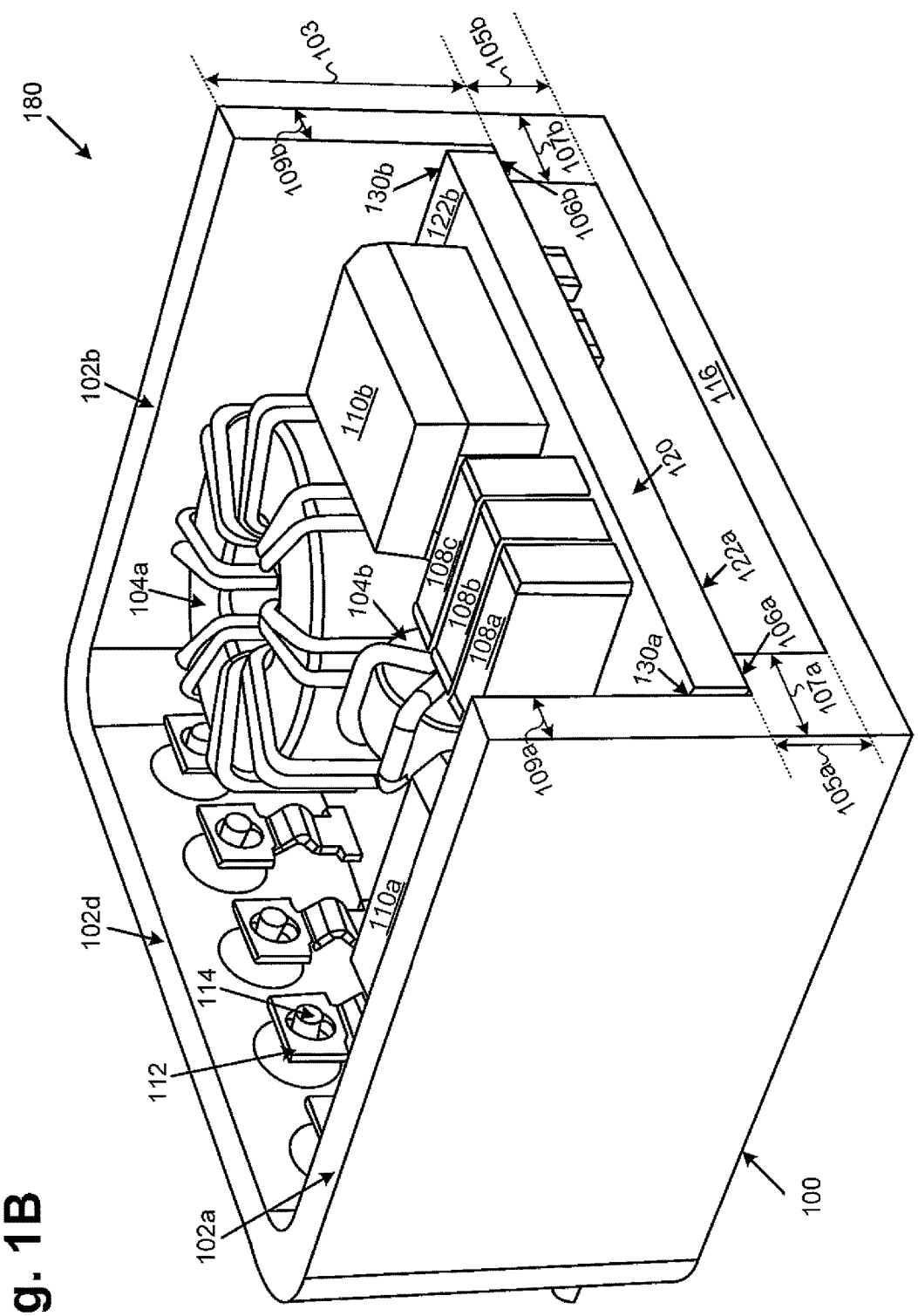
FIG. 1B illustrates a perspective view of a portion of a packaged assembly, according to one implementation of the present application.

FIG. 1B illustrates a perspective view of a portion of a packaged assembly, according to one implementation of the present application. In the present implementation, FIG. 1B is a perspective view of packaged assembly 180 along line B-B in FIG. 1A. With similar numerals representing similar features in FIG. 1A, packaged assembly 180 includes case 100, double-sided substrate 120 disposed on shelf 106a on wall 102a and shelf 106b on wall 102b of case 100, respectively. Among other components, a hermetic lid, an encapsulating molding compound or gap filler, and wall 102d in FIG. 1A are omitted from FIG. 1B for purposes of clarity, but may be included in packaged assembly 180.

As illustrated in FIG. 1B, case 100 includes walls 102a, 102b and 102c, shelves 106a and 106b on respective opposing walls 102a and 102b of case 100, and bottom plate 116. In the present implementation, shelves 106a and 106b are formed on opposing walls 102a and 102b, respectively, as part of case 100 for providing support for double-sided substrate 120. It should be noted that shelves are not formed on walls 102c and 102d since shelves 106a and 106b on respective opposing walls 102a and 102b are sufficient to provide support for double-sided substrate 120. As a consequence, additional hardware is not required to secure double-sided substrate 120 to case 100, thereby substantially reducing the overall weight of packaged assembly 180.

In the present implementation, shelves 106a and 106b may be formed by removing one or more portions of case 100 through a machine process. For example, shelves 106a and 106b may be formed removing a portion of case 100 by grinding case 100 from a top surface to depth 103 to form upper portions of walls 102a, 102b, 102c and 102d of case 100, then removing another portion of case 100 below depth 103 leaving a narrower width between opposing walls 102a and 102b to form a step on respective lower portions of each of walls 102a and 102b. As illustrated in FIG. 1B, width 107a of shelf 106a is greater than width 109a of the upper portion of wall 102a. Similarly, width 107b of shelf 106b is greater than width 109b of the upper portion of wall 102b. Since shelves 106a and 106b support double-sided substrate 120 at its edges, the contact area between double-sided substrate 120 and case 100 is minimized, thereby allowing more circuit elements and semiconductor devices to be built on both sides of double-sided substrate 120. As such, a high density substrate can be formed. Height 105a of shelf 106a is equal to height 105b of shelf 106b such that double-sided substrate 120 can be situated above and substantially parallel with bottom plate 116. Heights 105a and 105b may be of any appropriate value to provide sufficient clearance for semiconductor dies and circuit elements formed on front side 122a of double-sided substrate 120.

In the present implementation, double-sided substrate 120 is a thick film substrate made of beryllium oxide (BeO) or aluminum oxide ($Al_2O_3$). In other implementations, double-sided substrate 120 may include other suitable dielectric material. In the present implementation, double-sided substrate 120 is a single substrate, such as a PC board, which allows one or more semiconductor dies and circuit elements to be attached to both sides of the substrate. By using both sides of a single substrate, for example, of uniform composition, double-sided substrate 120 does not require wafer bonding steps to bond two substrates together, for example, using copper, thereby reducing manufacturing complexity and cost. In one implementation, packaged assembly 180 can be a hybrid assembly having bare semiconductor dies and packaged integrated circuits directly attached thereto.

As illustrated in FIG. 1B, double-sided substrate 120 includes toroidal inductors 104a and 104b, ceramic capacitor stacks 108a, 108b and 108c, tantalum capacitors 110a and 110b and other circuit elements are formed on back side 122b of double-sided substrate 120. As illustrated in FIG. 1B, double-sided substrate 120 also includes various circuit elements formed on front side 122a of double-sided substrate 120. In contrast to conventional assemblies where only one side of a substrate is used for receive circuit elements and semiconductor devices, implementations of the present application can double the usable area to which semiconductor dies and circuit elements can be attached, through the utilization of both front side 122a and back side 122b of double-sided substrate 120. As illustrated in FIG. 1B, leads 114 extend through wall 102c of case 100, and are electrically coupled to semiconductor devices and/or circuit elements formed on double-sided substrate 120 through lead frames 112 along wall 102c of case 100. In one implementation, leads 114 may be soldered to lead frames 112.

It should be noted that an epoxy may be applied and cured to perimeters 130a and 130b (as shown in FIG. 1B) along walls 102a and 102b respectively, to secure double-sided substrate 120 to case 100. In the present implementation, the epoxy may include any suitable material, such as commercially available ME7155 by AI Tech. In the present implementation, case 100 includes AlSi. Double-sided substrate 120 may include a material (e.g., $Al_2O_3$ or BeO) having a CTE closely matched with that of case 100. As a result, a change in volume (e.g., expansion or contraction) of case 100 in response to a change in temperature does not introduce stress to double-sided substrate 120 or perimeters 130a and 130b where the epoxy is applied and cured to secure double-sided substrate 120 to case 100. As such, additional hardware and hard soldering paste are not required to secure double-sided substrate 120 in place, thereby substantially reducing the overall weight of packaged assembly 180.

Figure 1C:
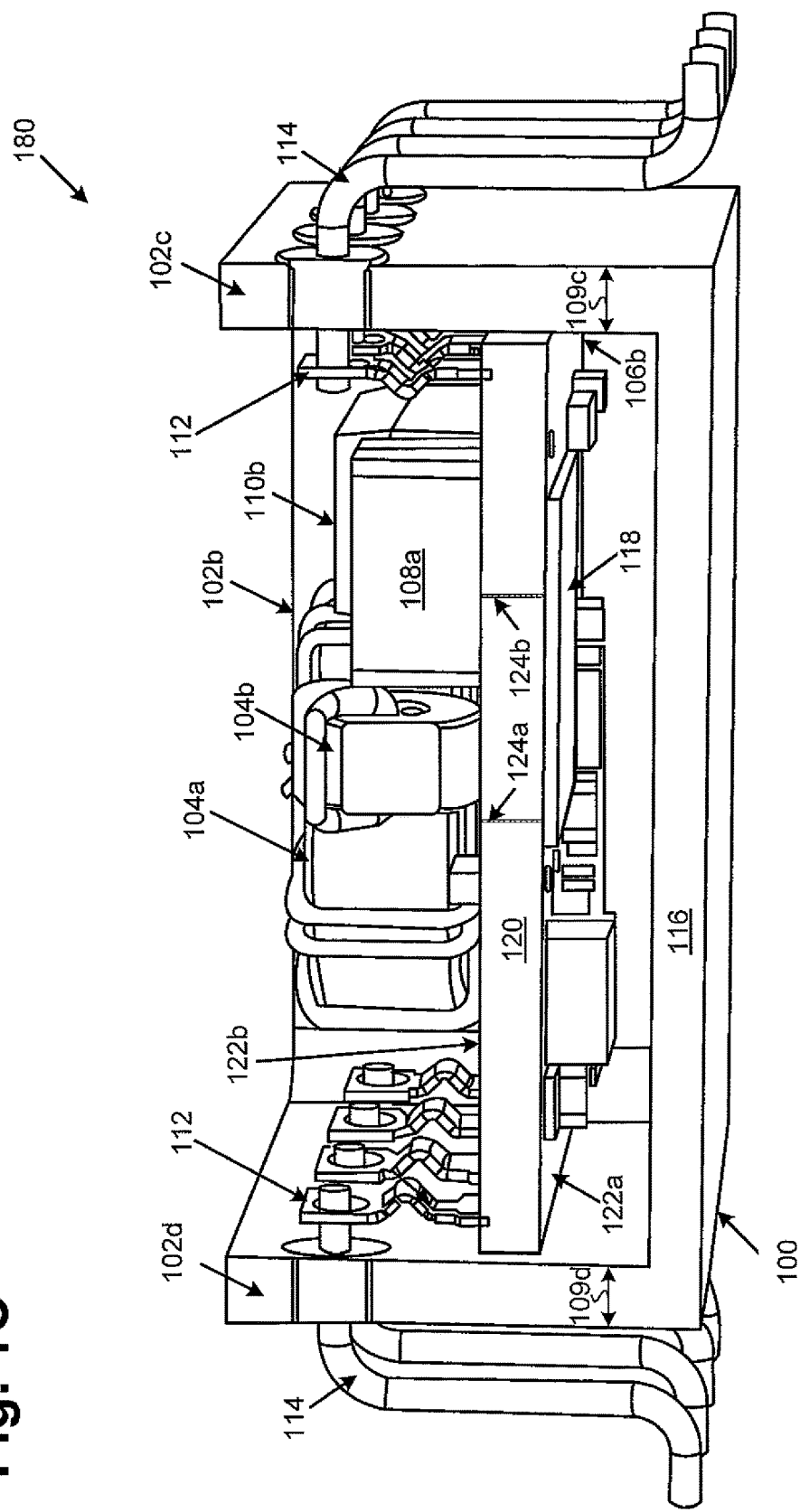
FIG. 1C illustrates a perspective view of a portion of a packaged assembly, according to one implementation of the present application.

FIG. 1C illustrates a perspective view of a portion of a packaged assembly, according to one implementation of the present application. In the present implementation, FIG. 1C is a perspective view of packaged assembly 180 along line C-C in FIG. 1A. With similar numerals representing similar features in FIG. 1A, packaged assembly 180 includes case 100 and double-sided substrate 120 having through substrate vias 124a and 124b extending from front side 122a to back side 122b of double-sided substrate 120. Among other components, a hermetic lid, an encapsulating molding compound or gap filler, and wall 102a in FIG. 1A are omitted from FIG. 1C for purposes of clarity, but may be included in packaged assembly 180.

In the present implementation, walls 102c, 102d and 102b having shelf 106b, and bottom plate 116 of case 100 are shown in FIG. 1C. It is noted that, in contrast to walls 102a and 102b on which shelves 106a and 106b are respectively formed as shown in FIG. 1B, walls 102c and 102d do not include shelves. As illustrated in FIG. 1C, walls 102c and 102d each have substantially uniform thicknesses 109c and 109d, respectively. As discussed above, since shelves 106a and 106b on respective opposing walls 102a and 102b are sufficient to provide support for double-sided substrate 120, additional shelves are not required on walls 102c and 102d of case 100, thus reducing the overall weight of packaged assembly 180. In the present implementation, thickness 109c of wall 102c is substantially equal to thickness 109d of wall 102d. In another implementation, thickness 109c of wall 102c and thickness 109d of wall 102d may be different.

In the present implementation, double-sided substrate 120 may include a power conversion circuit, such as a point of load converter formed thereon. For example, double-sided substrate 120 may include a pulse width modulator configured to generate control signals, which are pulse width modulated control signals. In one implementation, the pulse width modulator can perform two and/or three phase pulse width modulation to drive an inverter circuit (e.g., having a two or three phase bridge connected circuit) integrated on double-sided substrate 120. As illustrated in FIG. 1C, toroidal inductors 104a and 104b, ceramic capacitor stack 108a, tantalum capacitor 110b and various other circuit elements are shown on back side 122b of double-sided substrate 120. Also, semiconductor die 118 and various other circuit elements are formed on front side 122a of double-sided substrate 120.

In the present implementation, semiconductor die 118 includes a pulse width modulator (not explicitly shown in FIG. 1C) and various other circuits monolithically integrated thereon. In the present implementation, semiconductor die 118 includes silicon. In other implementations, semiconductor die 118 may include other suitable semiconductor material such as silicon-on-sapphire (SOS), silicon carbide (SiC), or the like. In the present implementation, semiconductor die 118 includes one or more power semiconductor devices (not explicitly shown in FIG. 1C). For example, semiconductor die 118 may include lateral and/or vertical conduction power semiconductor devices, such as field-effect transistors (FETs) or insulated-gate bipolar transistors (IGBTs), or the like.

As illustrated in FIG. 1C, semiconductor die 118 is directly attached to front side 122a of double-sided substrate 120. In one implementation, a power electrode of at least one power semiconductor device is attached to front side 122a of double-sided substrate 120, and is mechanically and electrically coupled to one or more circuit elements on back side 122b of double-sided substrate 120 through one or more TSVs, such as TSVs 124a and 124b in FIG. 1C. In one implementation, one or more TSVs can be utilized to provide routing and/or electrical connection between various circuit elements on back side 122b and a back side metal of semiconductor die 118 on front side 122a in any desired manner. In another implementation, one or more TSVs can serve to ground semiconductor die 118.

As illustrated in FIG. 1C, TSVs 124a and 124b may be metalized holes in double-sided substrate 120. In the present implementation, TSVs 124a and 124b are silver thick film filled vias for greater current carrying capability between front side 122a and back side 122b of double-sided substrate 120. It should be noted that although only TSVs 124a and 124b are shown in FIG. 1C, double-sided substrate 120 may include additional TSVs extending from front side 122a to back side 122b of double-sided substrate 120, and electrically coupling circuit elements and semiconductor dies on front side 122a to circuit elements and semiconductor dies on back side 122b of double-sided substrate 120.

It should be understood that walls 102a, 102b, 102c and 102d, bottom plate 116 and a hermetic lid (not explicitly shown in FIG. 1C) form a hermetically sealed case enclosing double-sided substrate 120 and all semiconductor dies and circuit elements formed thereon. Leads 114 extend through walls 102c and 102d, and are electrically coupled to double-sided substrate 120 by lead frames 112.

As discussed above, semiconductor die 118 is directly attached to front side 122a of double-sided substrate 120. As power semiconductor devices on semiconductor die 118 require packaging that has high thermal conductivity in order to maintain useful operation of the devices, case 100 having AlSi not only has good thermal characteristics, but also matching CTE characteristics with double-sided substrate 120 having BeO or $Al_2O_3$, for example. In one implementation, double-sided substrate 120 may also have good thermal characteristics to improve the thermal management on semiconductor dies and circuit elements formed thereon. Thus, in contrast to conventional assemblies with poorly matched substrate to package CTEs which require hard soldering paste, implementations of the present application only requires an epoxy applied along perimeters 130a and 130b of double-sided substrate 120 to secure double-sided substrate 120 to case 100. In addition, since additional hardware and hard soldering paste are not required to secure double-sided substrate 120 to case 100, packaged assembly 180 can have an very low mass (e.g., 15 grams or less).

Figure 1D:
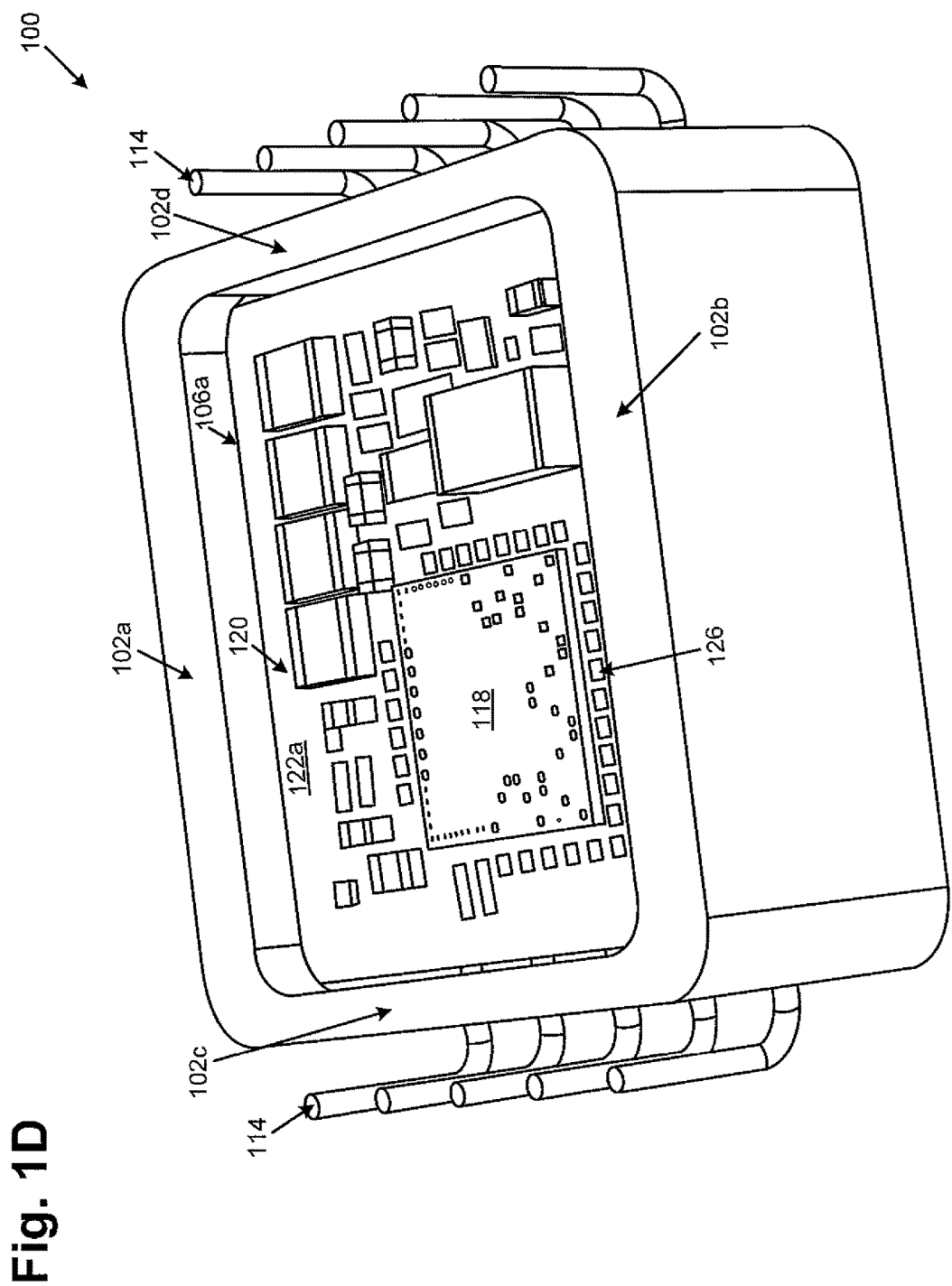
FIG. 1D illustrates a perspective view of a portion of a packaged assembly, according to one implementation of the present application.

FIG. 1D illustrates a perspective view of a portion of a packaged assembly, according to one implementation of the present application. With similar numerals representing similar features in FIG. 1A, packaged assembly 180 includes case 100 and double-sided substrate 120. Among other components, bottom plate 116 of case 100 in FIG. 1B is omitted from FIG. 1D for purposes of clarity, but may be included in packaged assembly 180.

As illustrated in FIG. 1D, case 100 includes walls 102a, 102b and 102c. Shelf 106a on wall 102a and shelf 106b (not explicitly shown in FIG. 1D) on wall 102b are configured to provide support for double-sided substrate 120. As can be seen in FIG. 1D, shelves are not formed on wall 102c or 102d since shelves 106a and 106b on respective opposing walls 102a and 102b are sufficient to provide support for double-sided substrate 120. As illustrated in FIG. 1D, semiconductor die 118 and various other circuit elements (e.g., resistors) are formed on front side 122a of double double-sided substrate 120. One or more bond pads 126 are disposed along the perimeters of semiconductor die 118 for wire-bonding.

In the present implementation, packaged assembly 180 has a length of approximately 1.0 inch., a width of approximately 1.0 inch., and a height of approximately 0.4 inch. In the present implementation, packaged assembly 180 has an overall weight of approximately 15 grams. In other implementations, packaged assembly 180 may have other dimensions and weight to suit the needs of a particular application. In the present implementation, double-sided substrate 120 has a length of approximately 0.82 inch., a width of approximately 0.82 inch., and a thickness of approximately of approximately 60 mils (i.e., one sixty thousandth of an inch). In other implementations, double-sided substrate 120 may have other dimensions to suit the needs of a particular application. In the present implementation, packaged assembly 180 may operate at an input voltage in the range of 3.0 to 13.0 volts and provide an output voltage in the range of 0.6 to 12.0 volts (e.g., 6-9 volts). In other implementations, packaged assembly 180 may operate at an input voltage of less than 3.0 volts or greater than 13.0 volts, and provide an output voltage of less than 0.6 volts or greater than 12 volts.

According to one implementation of the present application, a packaged assembly includes a double-sided substrate secured to a lightweight case by an epoxy. In one implementation, the case is made of a lightweight, thermally conductive, controlled expansion aluminum silicon matrix. In one implementation, the double-sided substrate allows to double the size of the circuitry relative to a conventional layout while keeping the foot print very small. In one implementation, the double-sided substrate is made of beryllium oxide or aluminum oxide, which has good matching CTE characteristics with the case made of aluminum silicon, thereby allowing the use of an epoxy to secure the double-sided substrate to the package shelves without a need for additional hardware or hard soldering paste. In one implementation, the double-sided substrate interconnects the circuitry on its front side to the circuitry on its back side using silver thick film filled vias for added current carrying capability between both sides. In one implementation, the circuitry on the double-sided substrate are electrically coupled to invertible leads made of copper-based metal matrix composite alloys mixed with aluminum, oxide and/or ceramic particles for increased electrical conductivity and mechanical strength. Thus, implementations of the present application combine high density circuitry with a lightweight case that has excellent thermal conductivity, which allow for a high power performance, low mass, and small footprint point of load packaged assembly, for example.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A packaged assembly comprising:
a case comprising a first coefficient of thermal expansion and shelves on opposing walls, wherein the case is hermetically sealed, wherein the case further comprises a lid and a bottom plate, and wherein the lid and the bottom plate are made of the same material;
a double-sided dielectric substrate disposed on the shelves of the case and comprising a second coefficient of thermal expansion, wherein the first coefficient of thermal expansion and the second coefficient of thermal expansion are closely matched;
a semiconductor die mounted on a first side of the double-sided dielectric substrate, wherein the semiconductor die comprises a first major surface attached to the first side of the double-sided dielectric substrate, and
a second major surface separated from the case by a gap, wherein the second major surface is parallel to and opposite of the first major surface;
circuit elements mounted on a second side of the double-sided dielectric substrate, wherein
the double-sided dielectric substrate is secured to the shelves of the case by an epoxy, and
the epoxy contacts the double-sided dielectric substrate on the same first side to which the semiconductor die is mounted; and
a plurality of leads rotatably coupled to the double-sided dielectric substrate by a plurality of lead frames, wherein
each of the plurality of leads extends completely through the case and a corresponding one of the plurality of lead frames,
each of the plurality of leads comprises a substantially 90° bend located outside of the case, and
each of the plurality of leads is rotatable relative to the case about an axis of rotation that is perpendicular to a respective surface of the case through which each of the plurality of leads passes.

2. The packaged assembly of claim 1, wherein the case comprises an aluminum silicon (AlSi) alloy.

3. The packaged assembly of claim 1, wherein the double-sided dielectric substrate comprises beryllium oxide (BeO) or aluminum oxide ($Al_2O_3$).

4. The packaged assembly of claim 1, wherein the semiconductor die on the first side of the double-sided dielectric substrate is coupled to at least one of the circuit elements on the second side of the double-sided dielectric substrate by a through substrate via.

5. The packaged assembly of claim 1, wherein the double-sided dielectric substrate is a thick film substrate.

6. The packaged assembly of claim 1, wherein the semiconductor die includes a pulse width modulator.

7. The packaged assembly of claim 1, wherein the semiconductor die includes at least one vertical conduction semiconductor device.

8. The packaged assembly of claim 1, wherein a point of load converter circuit is formed on the double-sided dielectric substrate.

9. The packaged assembly of claim 1, wherein the lid is only in direct contact with the walls of the case.

10. The packaged assembly of claim 1, wherein the case comprises exactly two shelves.

11. A packaged assembly comprising:
a case comprising an aluminum silicon (AlSi) alloy;
a double-sided substrate disposed on shelves of the case, wherein the double-sided substrate comprises a semiconductor die on a first side of the double-sided substrate coupled to at least one circuit element on a second side of the double-sided substrate; and a plurality of leads rotatably coupled to the double-sided substrate by a plurality of lead frames allowing each of the plurality of leads to be inverted from a first position to a second position, wherein each of the plurality of leads passes through the case and a corresponding one of the plurality of lead frames, each of the plurality of leads comprises a substantially 90° bend located outside of the case, each of the plurality of leads is rotatable relative to the case about an axis of rotation that is perpendicular to a respective surface of the case through which each of the plurality of leads passes, in the first position the substantially 90° bend of each of the plurality of leads is directed toward a top surface of the case, and in the second position the substantially 90° bend of each of the plurality of leads is directed toward a bottom surface of the case, the bottom surface being opposite the top surface.

12. The packaged assembly of claim 11, wherein the shelves are on opposing walls of the case.

13. The packaged assembly of claim 11, wherein the double-sided substrate comprises beryllium oxide (BeO) or aluminum oxide ($Al_2O_3$).

14. The packaged assembly of claim 11, wherein the semiconductor die on the first side of the double-sided substrate is coupled to the at least one circuit element on the second side of the double-sided substrate by a through substrate via.

15. The packaged assembly of claim 11, wherein the double-sided substrate is a thick film substrate.

16. The packaged assembly of claim 11, wherein the semiconductor die includes a pulse width modulator.

17. The packaged assembly of claim 11, wherein the semiconductor die comprises at least one vertical conduction semiconductor device.

18. The packaged assembly of claim 11, wherein the double-sided substrate is secured to the case by an epoxy.

19. The packaged assembly of claim 11, wherein the double-sided substrate is hermetically sealed within the case.

20. A packaged assembly comprising:

a package casing;

a first ledge extending from a first inner sidewall of the package casing;

a second ledge extending from a second inner sidewall of the package casing, the first inner sidewall facing the second inner sidewall; and a double-sided dielectric substrate supported by the first ledge and the second ledge, wherein the double-sided dielectric substrate comprises a semiconductor die on a first side of the double-sided dielectric substrate and a capacitor/inductor on a second side of the double-sided dielectric substrate; and a plurality of leads rotatably coupled to the double-sided dielectric substrate by a plurality of lead frames, wherein each of the plurality of leads extends completely through the package casing and a corresponding one of the plurality of lead frames, each of the plurality of leads comprises a substantially 90° bend located outside of the package casing, and each of the plurality of leads is rotatable relative to the package casing about an axis of rotation that is perpendicular to a respective surface of the package casing through which each of the plurality of leads passes.

21. The packaged assembly of claim 20, wherein a first coefficient of thermal expansion of the package casing and a second coefficient of thermal expansion of the double-sided dielectric substrate are closely matched.

22. The packaged assembly of claim 20, wherein the package casing is hermetically sealed.

* * * * *